US010063252B2

United States Patent
Cho et al.

(10) Patent No.: US 10,063,252 B2
(45) Date of Patent: Aug. 28, 2018

(54) CONTINUOUS DELTA-SIGMA MODULATOR FOR SUPPORTING MULTI-MODE

(71) Applicant: Electronics and Telecommunications Research Institute, Daejeon (KR)

(72) Inventors: Young Kyun Cho, Daejeon (KR); Bong Hyuk Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/868,786

(22) Filed: Jan. 11, 2018

(65) Prior Publication Data

US 2018/0212619 A1    Jul. 26, 2018

(30) Foreign Application Priority Data

Jan. 20, 2017    (KR) .................. 10-2017-0009804

(51) Int. Cl.
  *H03M 3/00*    (2006.01)
  *H03H 11/12*    (2006.01)

(52) U.S. Cl.
  CPC ........ *H03M 3/438* (2013.01); *H03H 11/1204* (2013.01); *H03M 3/422* (2013.01)

(58) Field of Classification Search
  CPC ...... H03M 3/438; H03M 3/422; H03M 3/362; H03M 3/364; H03H 11/1204

(Continued)

(56) References Cited

U.S. PATENT DOCUMENTS 6,087,969 A * 7/2000 Stockstad ............. H03M 3/394
                                          341/143
6,765,517 B1    7/2004 Ali
(Continued)

FOREIGN PATENT DOCUMENTS

KR    10-2009-0072053 A    7/2009
KR    10-2015-0084267 A    7/2015
(Continued)

OTHER PUBLICATIONS

Lynn Bos et al., "A Multirate 3.4-to-6.8mW 85-to-66dB DR GSM/Bluetooth/UMTS Cascade DT ΔΣM in 90nm Digital CMOS", 2009 IEEE International Solid-State Circuits Conference (ISSCC), pp. 176-177, Feb. 10, 2009.

(Continued)

*Primary Examiner* — Khai M Nguyen
(74) *Attorney, Agent, or Firm* — Rabin & Berdo, P.C.

(57) ABSTRACT

A delta-sigma modulator may comprise a loop filter for integrating and outputting a difference between an input signal and an analog signal; a quantizer for quantizing and outputting a signal output from the loop filter; and a digital-to-analog converter (DAC) for outputting the analog signal by digital-to-analog converting a signal output from the quantizer. Also, the loop filter may comprise an operational amplifier; and a circuit including at least one capacitor, at least one resistor, and at least one switch which are connected to the operational amplifier. Also, signal transfer characteristics of the loop filter satisfy a third-order transfer function or a second-order transfer function by turning on or off the at least one switch.

20 Claims, 4 Drawing Sheets

(58) Field of Classification Search
USPC .......................................................... 341/143
See application file for complete search history.

(56) References Cited

U.S. PATENT DOCUMENTS

| | | | |
|---|---|---|---|
| 7,525,465 B1 | 4/2009 | Elwan et al. | |
| 8,258,990 B2 * | 9/2012 | Dosho | H03M 3/404 330/10 |
| 8,462,030 B2 * | 6/2013 | Muhammad | H03M 3/392 341/143 |
| 8,519,878 B2 | 8/2013 | Jensen et al. | |
| 8,711,980 B2 | 4/2014 | Oliaei | |
| 8,937,567 B2 * | 1/2015 | Obata | H03F 3/45076 341/143 |
| 9,356,618 B2 * | 5/2016 | Cho | H03M 3/43 |
| 9,484,877 B2 | 11/2016 | Wang et al. | |
| 9,496,890 B2 * | 11/2016 | Cho | H03H 11/0433 |
| 2014/0022102 A1 | 1/2014 | Cho et al. | |
| 2015/0229292 A1 | 8/2015 | Cho et al. | |

FOREIGN PATENT DOCUMENTS

| | | |
|---|---|---|
| KR | 10-2015-0094906 A | 8/2015 |
| KR | 10-1559456 B1 | 10/2015 |

OTHER PUBLICATIONS

Wei Yan et al., "A Noise-Shaped Buck DC-DC Converter With Improved Light-Load Efficiency and Fast Transient Response", IEEE Transactions on Power Electronics, vol. 26, No. 12, pp. 3908-3924, Dec. 2011.

Kazuo Matsukawa et al., "A 10 MHz BW 50 fJ/conv. Continuous Time ΔΣ Modulator with High-order Single Opamp Integrator using Optimization-based Design Method", 2012 Symposium on VLSI Circuits Digest of Technical Papers, pp. 160-161, 2012.

Sebastian Zeller et al., "A 0.039mm$^2$ Inverter-Based 1.82mW 68.6dB-SNDR 10 MHz-BW CT-ΔΣ-ADC in 65 nm CMOS Using Power- and Area-Efficient Design Techniques", IEEE Journal of Solid-State Circuits, vol. 49, No. 7, pp. 1548-1560, Jul. 2014.

Ramin Zanbaghi et al., "An 80-dB DR, 7.2-MHz Bandwidth Single Opamp Biquad Based CT ΔΣ Modulator Dissipating 13.7-mW", IEEE Journal of Solid-State Circuits, vol. 48, No. 2, pp. 487-501, Feb. 2013.

* cited by examiner

CONTINUOUS DELTA-SIGMA MODULATOR FOR SUPPORTING MULTI-MODE

CROSS-REFERENCE TO RELATED APPLICATIONS

This application claims priority to Korean Patent Application No. 10-2017-0009804 filed on Jan. 20, 2017 in the Korean Intellectual Property Office (KIPO), the entire contents of which are hereby incorporated by reference.

BACKGROUND

1. Technical Field

The present disclosure relates to a continuous delta-sigma modulator for supporting multi-mode, and more specifically, to a continuous delta-sigma modulator operating in multi-mode by using a loop filter capable of order conversion.

2. Related Art

The delta-sigma modulation scheme is an analog-to-digital or a digital-to-analog conversion scheme derived from a delta modulation scheme. It is used for wireless communication systems such as a 3GPP (third generation partnership project) long term evolution (LTE) system or a worldwide interoperability for microwave access (WiMax) system due to its anti-aliasing characteristics and high signal-to-noise (SNR) ratio.

The principle of delta-sigma modulation lies in predicting of a signal, deriving an error of the signal, and correcting the error using the cumulative error. According to this, when the cumulative error is finite, an average of an input signal and an average of an output signal may become equal. Meanwhile, a delta-sigma modulator used in a receiving end of a transmission and reception system is applied to various communication systems due to its noise shaping characteristics. However, such the modulator is generally limited in operation with only a single signal bandwidth and a single clock frequency due to design complexity and difficulty in maintaining stability.

For example, a global system for mobile communication (GSM) system that requires a high SNR in a narrow bandwidth and a universal mobile telecommunications system (UMTS) that requires a medium SNR in a wide bandwidth should use delta-sigma modulators having different structures and orders. Therefore, since different modulators should be implemented according to the system, the size and power consumption of the system increase.

SUMMARY

Accordingly, embodiments of the present disclosure provide a loop filter capable of order conversion.

Also, embodiments of the present disclosure provide a delta-sigma modulator using the loop filter capable of order conversion.

In order to achieve the objective of the present disclosure, a loop filter may comprise an operational amplifier; and a circuit including at least one capacitor, at least one resistor, and at least one switch which are connected to the operational amplifier. Here, signal transfer characteristics of the loop filter may satisfy a third-order transfer function or a second-order transfer function by turning on or off the at least one switch.

The circuit may include a first capacitor, a second capacitor, and a third capacitor which are connected in series between a first input end of the operational amplifier and an output end of the operational amplifier.

The circuit may include a first resistor whose one end is connected to a third node to which an input signal of the loop filter is applied and whose the other end is connected to the first input end of the operational amplifier; a second resistor, a fourth resistor, and a sixth resistor whose one ends are connected to a first node between a first capacitor and a second capacitor; and a third resistor, a fifth resistor, and a seventh resistor whose one ends are connected to a second node between the second capacitor and a third capacitor.

The circuit may include a first inverting circuit for outputting an inverted signal by inverting the input signal; and a second inverting circuit for outputting an inverted signal by inverting a signal output from an output end of the operational amplifier. Also, the other ends of the second resistor and the third resistor are connected to a ground, the other end of the fourth resistor is connected to the output end of the operational amplifier, the other end of the fifth resistor is connected to an output end of the second inverting circuit, the other end of the sixth resistor is connected to an output end of the first inverting circuit, and the other end of the seventh resistor is connected to the third node.

The circuit may further include a first switch connected between the first node and the sixth resistor; a second switch connected between the second node and the seventh resistor; a third switch connected to the first node and the input end of the operational amplifier and configured in parallel with the first capacitor; and a fourth switch connected between the first node and the second resistor.

The circuit may satisfy the third-order transfer function by turning on the first switch, the second switch, and the fourth switch, and turning off the third switch.

The circuit may satisfy the second-order transfer function by turning off the first switch, the second switch, and the fourth switch, and turning on the third switch.

The seventh resistor may be a variable resistor, and a bandwidth variation due to control of the at least one switch may be adjusted by adjusting the seventh resistor.

At least one of the first resistor, the sixth resistor, and the seventh resistor may be a variable resistor, and a loop gain may be changed by adjusting the at least one of the first resistor, the sixth resistor, and the seventh resistor.

The fourth resistor and the fifth resistor may be variable resistors, and a resonance condition may be adjusted by adjusting the fourth resistor and the fifth resistor.

The resonance condition may be maintained even when controlling the at least one switch to satisfy the third-order transfer function or the second-order transfer function.

In order to achieve the objective of the present disclosure, a delta-sigma modulator may comprise a loop filter for integrating and outputting a difference between an input signal and an analog signal; a quantizer for quantizing and outputting a signal output from the loop filter; and a digital-to-analog converter (DAC) for outputting the analog signal by digital-to-analog converting a signal output from the quantizer. Also, the loop filter may comprise an operational amplifier; and a circuit including at least one capacitor, at least one resistor, and at least one switch which are connected to the operational amplifier. Here, signal transfer characteristics of the loop filter may satisfy a third-order transfer function or a second-order transfer function by turning on or off the at least one switch.

The circuit may include a first capacitor, a second capacitor, and a third capacitor which are connected in series between a first input end of the operational amplifier and an output end of the operational amplifier.

The circuit may include a first resistor whose one end is connected to a third node to which an input signal of the loop filter is applied and whose the other end is connected to the first input end of the operational amplifier; a second resistor, a fourth resistor, and a sixth resistor whose one ends are connected to a first node between a first capacitor and a second capacitor; and a third resistor, a fifth resistor, and a seventh resistor whose one ends are connected to a second node between the second capacitor and a third capacitor.

The circuit may include a first inverting circuit for outputting an inverted signal by inverting the input signal; and a second inverting circuit for outputting an inverted signal by inverting a signal output from an output end of the operational amplifier. Also, the other ends of the second resistor and the third resistor are connected to a ground, the other end of the fourth resistor is connected to the output end of the operational amplifier, the other end of the fifth resistor is connected to an output end of the second inverting circuit, the other end of the sixth resistor is connected to an output end of the first inverting circuit, and the other end of the seventh resistor is connected to the third node.

The circuit may further include a first switch connected between the first node and the sixth resistor; a second switch connected between the second node and the seventh resistor; a third switch connected to the first node and the input end of the operational amplifier and configured in parallel with the first capacitor; and a fourth switch connected between the first node and the second resistor.

The circuit may satisfy the third-order transfer function by turning on the first switch, the second switch, and the fourth switch, and turning off the third switch.

The circuit may satisfy the second-order transfer function by turning off the first switch, the second switch, and the fourth switch, and turning on the third switch.

In order to achieve the objective of the present disclosure, a terminal may include a delta-sigma modulator. Here, the delta-sigma modulator may include a loop filter comprising an operational amplifier; and a circuit including at least one capacitor, at least one resistor, and at least one switch which are connected to the operational amplifier, and signal transfer characteristics of the loop filter may satisfy a third-order transfer function or a second-order transfer function by turning on or off the at least one switch.

The circuit may include a first capacitor, a second capacitor, and a third capacitor which are connected in series between a first input end of the operational amplifier and an output end of the operational amplifier.

Using the loop filter or the delta-sigma modulator according to the present disclosure, multiple modes can be supported. Also, since the loop filter or the delta-sigma modulator is implemented by using a single operational amplifier, power consumption and size can be reduced. Also, since the order conversion is possible, stable output at a wide sampling frequency can be achieved. Also, it is made possible to freely adjust a resonance frequency, a loop gain, a sampling frequency, a signal to noise (SNR) ratio, and a signal bandwidth. In addition, even when the order is adjusted, the same resonance condition can be maintained, and the maximum SNR can be obtained without changing the passive elements. Also, the order can be changed by using a switch without changing the active elements.

BRIEF DESCRIPTION OF DRAWINGS

Embodiments of the present disclosure will become more apparent by describing in detail embodiments of the present disclosure with reference to the accompanying drawings, in which.

DETAILED DESCRIPTION

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings.

Figure 1:
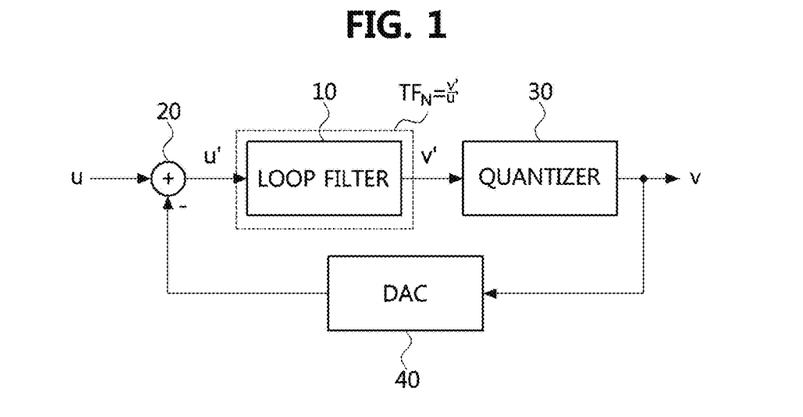
FIG. 1 is a conceptual diagram illustrating a delta-sigma modulator according to an embodiment of the present disclosure.

FIG. 1 is a conceptual diagram illustrating a delta-sigma modulator according to an embodiment of the present disclosure.

Referring to FIG. 1, a delta-sigma modulator may comprise a loop filter 10, an adder 20, a quantizer 30, and a digital-to-analog converter (DAC) 40.

Here, the adder 20 may transmit a signal u' obtained by subtracting an output signal of the DAC 40 from an input signal u input from the outside to the loop filter 10. That is, an error between the input signal u and a signal obtained by digital-to-analog converting an output signal v may be transferred to the loop filter 10 so that the error is accumulated in the loop filter 10 and the error may be corrected thereby.

Here, the loop filter 10 may integrate the difference u' between the input signal u and the analog signal converted from the output signal v, and output the integrated signal v'. Specifically, the difference u' between the input signal u and the analog signal may be represented by the error, and the error may be accumulated through one or more integrators. Here, the loop filter 10 may include as many integrators as the order of the loop filter to be implemented. For example, if implemented as a second-order loop filter, the loop filter 10 may include two integrators, and if implemented as a third-order loop filter, the loop filter 10 may include three integrators. Here, the loop filter 10 may be implemented as a feed-back type, but may be implemented as a feed-forward type.

Here, the loop filter 10 has a conditionally stable characteristic because its state stability decreases as the order of the loop filter 10 increases. Therefore, the higher the order, the more stable the operation can be only through a combination of a specific sampling frequency $F_s$ and a specific loop gain factor. Thus, in general, only a fixed signal bandwidth may be used to maintain the state stability.

The quantizer 30 may quantize the signal v' output from the loop filter 10 according to a sampling frequency $F_s$ and output the quantized signal. Here, the quantizer 30 may output the output signal v by comparing the signal v' from the loop filter 10 with a reference value.

Here, the DAC 40 may output the analog signal through digital-to-analog conversion of the signal v output from the quantizer 30 and may be implemented as a 1-bit DAC. However, the DAC 40 may also be implemented as a multi-bit DAC, and may include a comparator. Meanwhile, a feedback by the DAC may be implemented in a non-return-to-zero (NRZ) form or in a return-to-zero (RZ) form.

Figure 2:
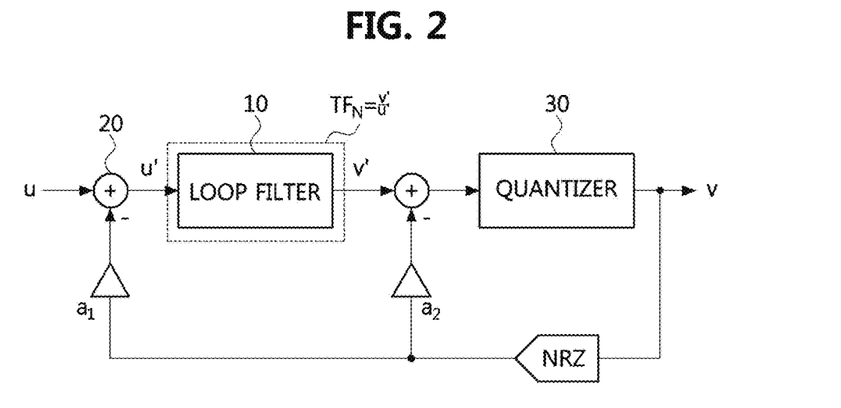
FIG. 2 is a conceptual diagram illustrating a DAC implemented in NRZ form in a delta-sigma modulator including a loop filter according to an embodiment of the present disclosure.

FIG. 2 is a conceptual diagram illustrating a DAC implemented in NRZ form in a delta-sigma modulator including a loop filter according to an embodiment of the present disclosure.

Referring to FIG. 2, an example of implementing the DAC in NRZ form will be described.

As shown in FIG. 2, when the feedback by the DAC is implemented in NRZ form, a separate feedback loop may be included in the output v' of the loop filter 10 to compensate for an excess loop delay (ELD). That is, a comparator $a_1$ may be connected to the adder 20 which outputs an error with the input signal u, and a comparator $a_2$ may be additionally applied to the separate feedback loop.

In the cases of FIGS. 1 and 2 as one example, the quantizer 30 and the DAC 40 may be applied differently depending on the implementation, and may have an additional feedback loop between the integrators of the loop filter. Also, since the delta-sigma modulator may be implemented as further including a separate digital filter at the rear end of the output v, the delta-signal modulator including the loop filter according to an embodiment of the present disclosure should not be construed by being limited by the concepts of FIGS. 1 and 2.

However, for convenience of explanation, it is assumed that the DAC is implemented in the RZ form in which the ELD is not compensated.

Figure 3:
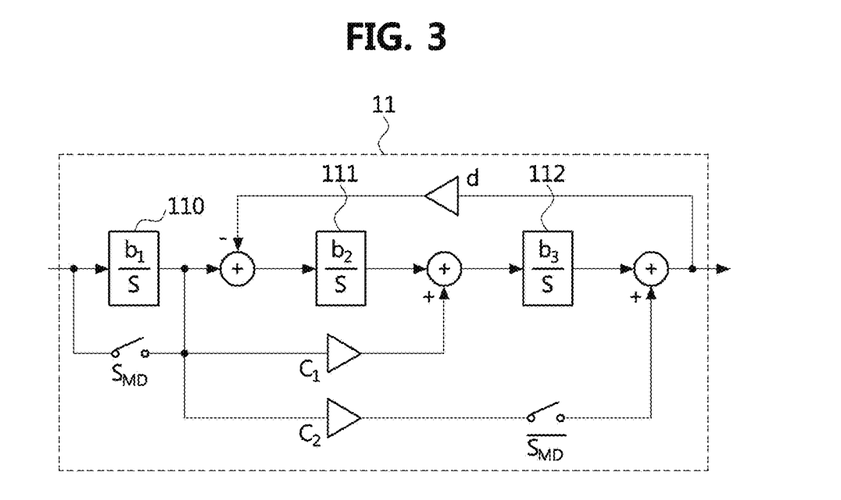
FIG. 3 is a block diagram illustrating a third-order loop filter according to an embodiment of the present disclosure.
Figure 4:
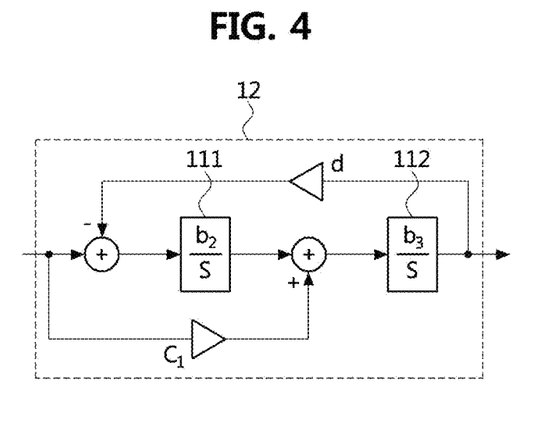
FIG. 4 is a block diagram illustrating a second-order loop filter according to an embodiment of the present disclosure.
Figure 5:
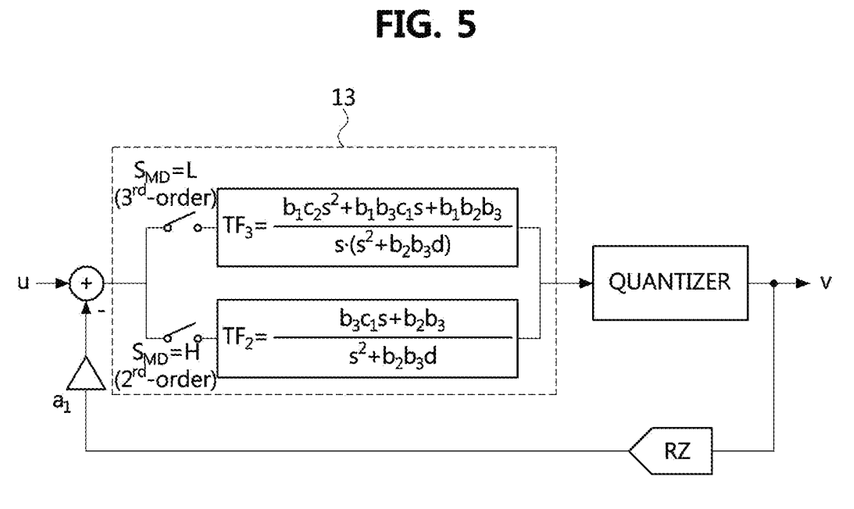
FIG. 5 is a block diagram illustrating a delta-sigma modulator including a loop filter according to an embodiment of the present disclosure.

FIG. 3 is a block diagram illustrating a third-order loop filter according to an embodiment of the present disclosure, FIG. 4 is a block diagram illustrating a second-order loop filter according to an embodiment of the present disclosure, and FIG. 5 is a block diagram illustrating a delta-sigma modulator including a loop filter according to an embodiment of the present disclosure.

Referring to FIGS. 3 to 5, a concept of switching between a second-order loop filter and a third-order loop filter will be described.

First, referring to FIG. 3, an example of a case where the loop filter in FIGS. 1 and 2 is configured as a third-order loop filter may be described.

Here, a third-order loop filter 11 may be implemented including a first integrator 110, a second integrator 111, and a third integrator 112. Also, an output of the first integrator 110 may be feed-forwarded to have a coefficient $C_1$, and added to an output of the second integrator 111. Also, an output of the second integrator 111 may be feed-forwarded to have a coefficient $C_2$ and added to an output of the third integrator 112.

Here, an output of the loop filter 11 configured as a third-order loop filter may be fed back to have a coefficient d and subtracted from the output of the first integrator 110.

A transfer function ($TF_3$) of the third-order loop filter 11 according to FIG. 3 may be derived as shown in Equation 1 below.

$$TF_3 = \frac{b_1 c_2 s^2 + b_1 b_3 c_1 s + b_1 b_2 b_3}{s \cdot (s^2 + b_2 b_3 d)} \quad \text{[Equation 1]}$$

Referring to Equation 1 above, the transfer function $TF_3$ having three poles and two zeros may be derived.

Here, if one integrator is removed by adding two switches as shown in FIG. 3, it may be possible to switch the third-order loop filter to a second-order loop filter having two poles.

Referring to FIG. 3, a first switch $S_{MD}$ may be added in parallel with the first integrator 110 to remove the first integrator 110, and a second switch $S_{MD}$ may be added to a loop which feed-forwards the output of the first integrator 110 to the output of the third integrator 112.

That is, a second-order loop filter 12 obtained by turning on the first switch to remove the first integrator 110 and turning off the second switch to remove the feed-forward loop is shown in FIG. 4. Referring to FIG. 4, the second-order loop filter 12 includes only the second integrator 111 and the third integrator 112 without the first integrator 110. Also, the second-order loop filter may be configured to include one feed-forward loop and one feed-back loop.

A transfer function ($TF_2$) of the second-order loop filter according to FIG. 4 may be derived as shown in Equation 2 below.

$$TF_2 = \frac{b_3 c_1 s + b_2 b_3}{s^2 + b_2 b_3 d} \quad \text{[Equation 2]}$$

Referring to Equation 2 above, the transfer function $TF_2$ having two poles and one zero may be derived.

As shown in FIG. 5, the third-order loop filter 11 and the second-order loop filter 12 according to FIG. 3 and FIG. 4 may be applied to the loop filter 10 of FIG. 1.

Referring to FIG. 5, the loop filter 10 shown in FIG. 1 may be implemented as a circuit 13 which switches between the transfer function $TF_3$ in Equation 1 and the transfer function $TF_2$ in Equation 2. Therefore, when the loop filter 13 capable of order conversion is used, compared with a conventional method of turning on or off an integrator circuit and adjusting coefficients to compensate the same, the order conversion between the second-order and third-order may be possible through the simple switching.

Hereinafter, a mode switching method (or, order conversion method) between the second-order loop filter and the third-order loop filter will be described in further detail.

Figure 6:
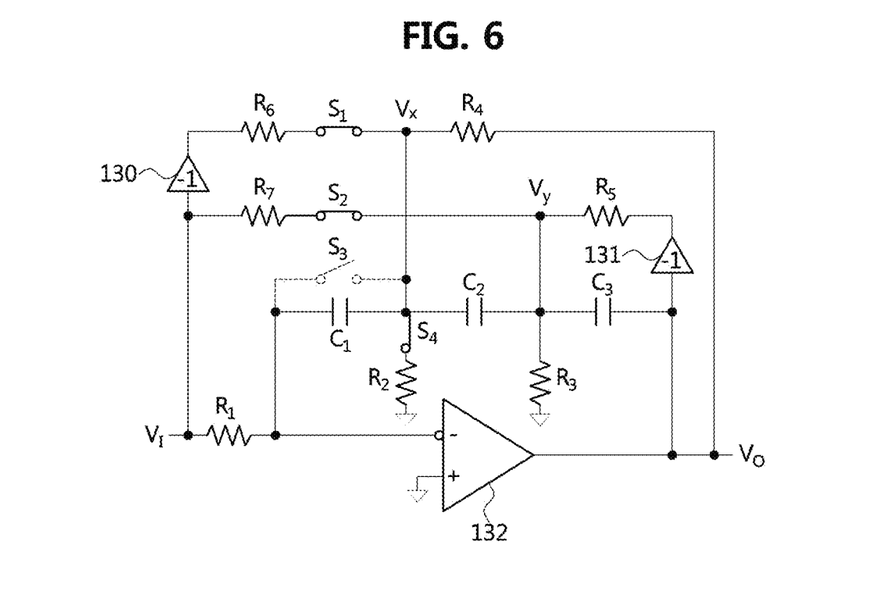
FIG. 6 is a first circuit diagram of a loop filter according to an embodiment of the present disclosure.
Figure 7:
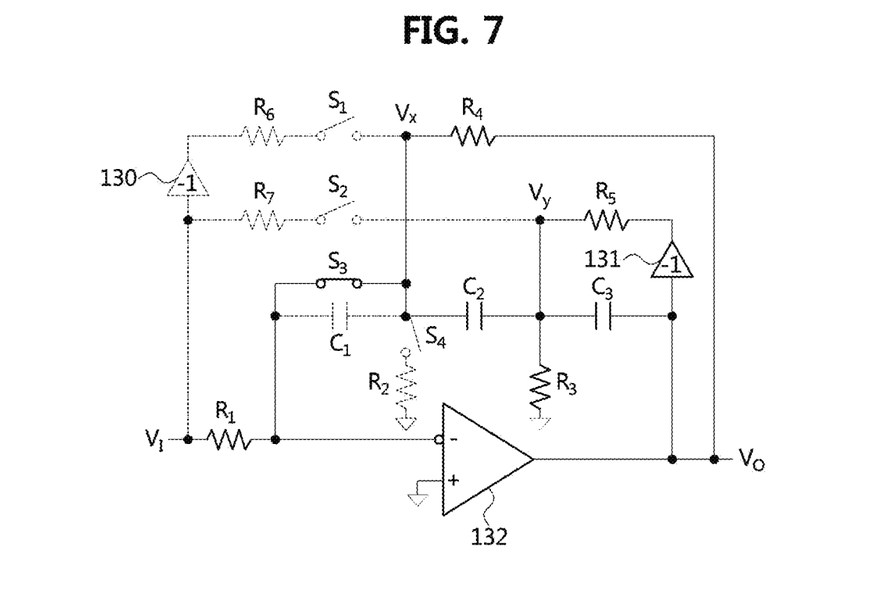
FIG. 7 is a second circuit diagram of a loop filter according to an embodiment of the present disclosure.

FIG. 6 is a first circuit diagram of a loop filter according to an embodiment of the present disclosure, and FIG. 7 is a second circuit diagram of a loop filter according to an embodiment of the present disclosure.

Referring to FIG. 6, a circuit in which a loop filter is implemented with a single operational amplifier may be described.

In general, a third-order loop filter may be implemented using three operational amplifiers. However, if three operational amplifiers are used, the size and power consumption of the entire circuit are increased due to the operational amplifiers which are active elements. Therefore, it may be advantageous to configure the third-order loop filter by using a single operational amplifier for power consumption and circuit integration.

Referring to FIG. 6, a loop filter may comprise a single operational amplifier 132 and a circuit including at least one capacitor (e.g., $C_1 \sim C_3$), at least one resistor (e.g., $R_1 \sim R_7$), and at least one switch (e.g., $S_1 \sim S_4$), which are connected to the operational amplifier 132. Here, the operational amplifier 132 may include a first input end and a second input end, and may operate as a differential amplifier by receiving differential inputs using the first and second input ends.

Here, signal transfer characteristics of the loop filter may satisfy the third-order transfer function $TF_3$ or the second-order transfer function $T_2$ by controlling ON/OFF of at least one switch.

Specifically, the circuit may include a first capacitor $C_1$, a second capacitor $C_2$, and a third capacitor $C_3$ which are connected in series between the first input end and an output terminal $V_o$ of the operational amplifier 132.

Also, the circuit may include a first resistor $R_1$ whose one end is connected to a third node $V_f$ to which the input signal of the loop filter is applied and whose the other end is connected to the first input end of the operational amplifier 132, a second resistor $R_2$, a fourth resistor $R_4$, and a sixth resistor $R_6$ whose one ends are connected to a first node $V_x$ between the first capacitor $C_1$ and the second capacitor $C_2$, a third resistor $R_3$, a fifth resistor $R_5$, and a seventh resistor $R_7$ whose one ends are connected to a second node $V_y$ between the second capacitor $C_2$ and the third capacitor $C_3$.

Also, the circuit may include a first inverting circuit 130 for inverting and outputting the input signal and a second inverting circuit 131 for inverting and outputting a signal output from the output terminal $V_o$ of the operational amplifier 132. Here, the first inverting circuit 130 and the second inverting circuit 131 may provide a negative signal within the loop filter.

The other ends of the second resistor $R_2$ and the third resistor $R_3$ may be connected to a ground and the other end of the fourth resistor $R_4$ may be connected to the output terminal $V_o$ of the operational amplifier 132. The other end of the fifth resistor $R_5$ may be connected to the output end of the second inverting circuit 131, and the other end of the sixth resistor $R_6$ may be connected to the output end of the first inverting circuit 130. Also, the other end of the seventh resistor $R_7$ may be connected to the third node $V_f$.

Here, the circuit may further include a first switch $S_1$ connected between the first node $V_x$ and the sixth resistor $R_6$, a second switch $S_2$ connected between the second node $V_y$ and the seventh resistor $R_7$, a third switch $S_3$ configured in parallel with the first capacitor $C_1$ as connected to the first node $V_x$ and the input end of the operational amplifier 132, and a fourth switch $S_4$ connected between the first node $V_x$ and the second resistor $R_2$.

Here, the circuit may satisfy the third-order transfer function by turning on the first switch $S_1$, the second switch $S_2$, and the fourth switch $S_4$, and turning off the third switch $S_3$.

Here, the circuit may satisfy the second-order transfer function by turning off the first switch $S_1$, the second switch $S_2$, and the fourth switch $S_4$, and turning on the third switch $S_3$.

Specifically, referring to FIG. 7, turning off the first switch $S_1$ may remove the sixth resistor $R_6$ and the first inverting circuit 130 from the circuit, and turning off the second switch $S_2$ may remove the seventh resistor $R_7$ from the circuit.

Also, when the third switch $S_3$ is turned on, the influence of the first capacitor $C_1$ may be removed. Also, when the fourth switch $S_4$ is turned off, the second resistor $R_2$ may be removed.

That is, referring to FIGS. 6 and 7, some passive elements may be removed from the circuit by using at least one switch to the third-order loop filter implemented by one operational amplifier 132 so that the third-order loop filter can operate as a second-order loop filter.

First, in interpreting the third-order loop filter according to FIG. 6, for ease of calculation and analysis, respective capacitors may be defined as being in a relationship of $C_1=2C_2=C_3=C$, and respective capacitors may be defined as being in a relationship of $R_X=R_2\|R_4\|R_6$ and $R_Y=R_3\|R_5\|R_7$.

Based on the relationship defined above, the transfer function (TF$_3$, proposed) of the third-order loop filter according to FIG. 6 may be derived as Equation 3 below.

$$TF_{3,proposed} = -\frac{s^2 \cdot \frac{1}{C}\left(\frac{4}{R_1}+\frac{1}{R_7}-\frac{3}{R_6}\right)+s\cdot \frac{1}{C^2}\left[\frac{3}{R_1}\left(\frac{1}{R_X}+\frac{1}{R_Y}\right)-\frac{2}{R_6 R_Y}\right]+\frac{2}{C^3 R_1}\left(\frac{1}{R_X R_Y}\right)}{s\cdot\left(s^2+\frac{2}{C^2 R_4 R_Y}\right)} \quad \text{[Equation 3]}$$

Also, a resonance condition of the third-order loop filter shown in FIG. 6 may be derived as shown in Equation 4 below.

$$R_4=3\cdot R_5 \quad \text{[Equation 4]}$$

Meanwhile, the transfer function (TF$_2$, proposed) of the second-order loop filter according to FIG. 7 may be derived as shown in Equation 5 below based on the relationship between the capacitors and the resistors defined above.

$$TF_{2,proposed} = -\frac{s\cdot\frac{3}{CR_1}+\frac{2}{C^2 R_1}\left(\frac{1}{R_3}+\frac{1}{R_5}\right)}{s^2+\frac{2}{C^2 R_4}\left(\frac{1}{R_3}+\frac{1}{R_5}\right)} \quad \text{[Equation 5]}$$

Also, a resonance condition of the second-order loop filter shown in FIG. 7 may be derived as shown in Equation 6 below.

$$R_4=3\cdot R_5 \quad \text{[Equation 6]}$$

Comparing the Equations 4 and 6, the fourth resistor $R_4$ and the fifth resistor $R_5$ are variable resistors, and the resonance condition may be controlled by varying the resistances of the fourth resistor $R_4$ and the fifth resistor $R_5$.

Also, it may be seen that the resonance condition may be maintained even if at least one switch is adjusted to satisfy the third-order transfer function or the second-order transfer function.

The resonance condition plays a role of adjusting positions of zeros in a noise transfer function (NTF), so that maintaining of resonance condition may mean that the delta-sigma modulator has a maximum SNR for a specific signal bandwidth.

Specifically, when the resonance condition is also changed during the order conversion of the loop filter, in order to obtain the maximum SNR, values of other passive elements should be readjusted, so that an increase in the total circuit size and power consumption may not be avoided. However, if the resonance condition is maintained, the maximum SNR may be achieved without readjusting the values of the passive elements.

Also, the signal bandwidth of the second-order loop filter and the third-order loop filter described above may be adjusted through the resonance frequency. The resonance frequency of the second-order loop filter and the third-order loop filter may be derived under a condition that the denominator of each transfer function becomes zero, and the resonance frequency ratio S of the second-order loop filter and the third-order loop filter may be derived as shown in Equation 7 below.

$$S = \sqrt{\frac{\frac{1}{R_3}+\frac{1}{R_5}}{\frac{1}{R_3}+\frac{1}{R_5}+\frac{1}{R_7}}} \quad \text{[Equation 7]}$$

Referring to Equation 7, the numerator and denominator in the root of the resonance frequency ratio S may respectively correspond to a conductance of the third resistor $R_3$ and the fifth resistor $R_5$, and a conductance of the third resistor $R_3$, the fifth resistor $R_5$, and the seventh resistor $R_7$ in FIGS. 7 and 6.

Accordingly, a difference in bandwidth may occur in the second-order loop filer in FIG. 7 due to the seventh resistor $R_7$ as compared with the loop filter in FIG. 6, and the bandwidth of the second-order loop filter may be reduced as the seventh resistor $R_7$ is removed. Therefore, in relation to the bandwidth of the third-order loop filter, the seventh resistor $R_7$, which is a variable resistor, may be adjusted to adjust the bandwidth variation according to the order conversion.

Meanwhile, when the third-order loop filter is switched to the second-order loop filter, the stability condition is changed according to the order conversion, so that stability may be a problem. Usually, in order to maintain the stability of the delta-sigma modulator, the feedback coefficient of the DAC or values of the passive elements may be changed.

However, the loop filter capable of order conversion through the switching according to the present disclosure can adjust a loop gain to maintain stability. Specifically, since the second-order loop filter is relatively more stable than the third-order loop filter, if the stability of the third-order loop filter is satisfied first and then the loop gain of the second-order loop filter after the conversion is adjusted, the stability of the delta-sigma modulator can be maintained before and after the order conversion.

Specifically, a loop gain ratio (LGR) of the third-order loop filter of FIG. 6 and the second-order loop filter of FIG. 7 according to the present disclosure may be derived as shown in Equation 8 below.

$$LGR = \frac{\frac{3}{R_1}}{\frac{4}{R_1}+\frac{1}{R_7}-\frac{3}{R_6}} \quad \text{[Equation 8]}$$

Here, the numerator of the LGR may be the first-order term of the numerator of the transfer function of the second-order loop filter according to Equation 5, and the denominator of the LGR may be the second-order term of the numerator of the transfer function of the third-order loop filter according to Equation 3.

Therefore, in the loop filter according to an embodiment of the present disclosure, at least one of the first resistor $R_1$, the sixth resistor $R_6$, and the seventh resistor $R_7$ is a variable resistor, and the loop gain can be changed by adjusting at least one of the first resistor $R_1$, the sixth resistor $R_6$, and the seventh resistor $R_7$. Accordingly, even in case of the order conversion, it is made possible to maintain high stability.

Figure 8:
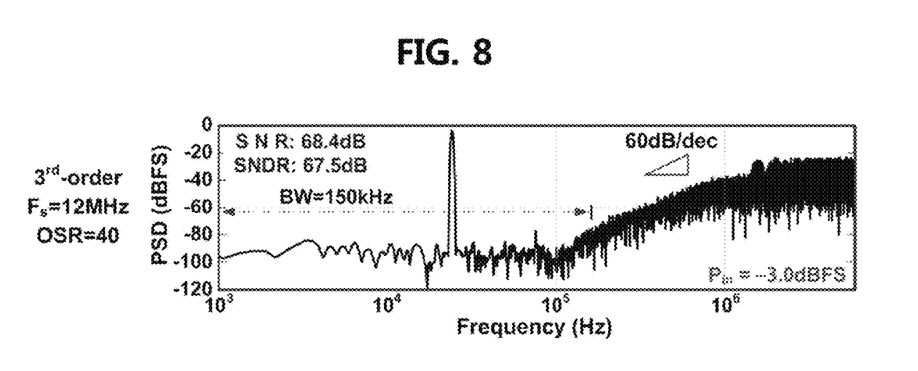
FIG. 8 is a graph illustrating a power spectral density (PSD) for a third-order delta-sigma modulator operating at 12 MHz sampling frequency according to an embodiment of the present disclosure.
Figure 9:
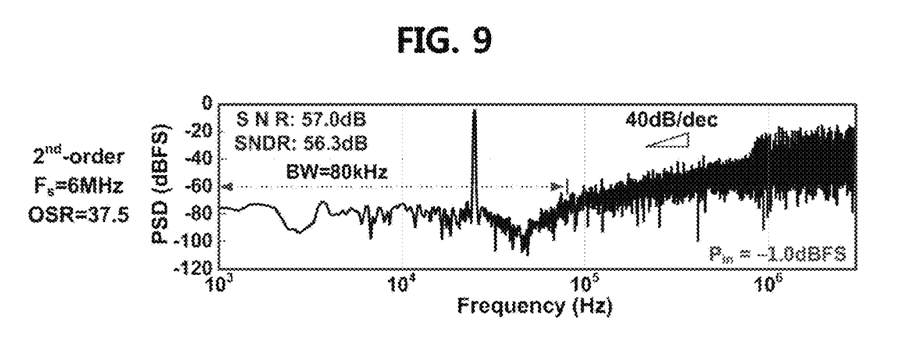
FIG. 9 is a graph illustrating a PSD for a second-order delta-sigma modulator operating at 6 MHz sampling frequency according to an embodiment of the present disclosure.
Figure 10:
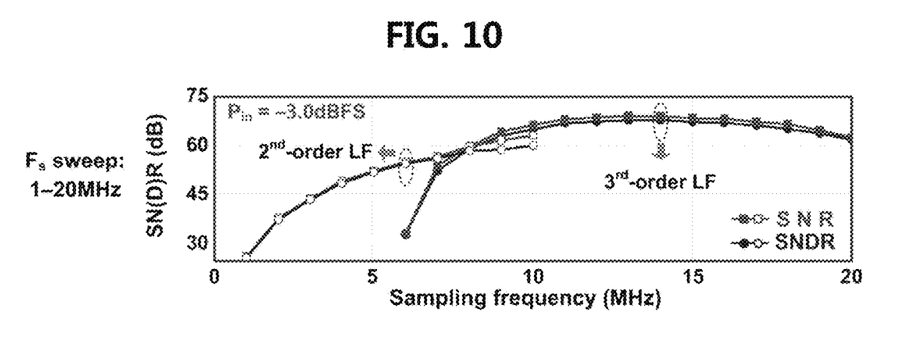
FIG. 10 is a graph illustrating variation of SNR due to change of sampling frequency by using a delta-sigma modulator according to an embodiment of the present disclosure.

FIG. 8 is a graph illustrating a power spectral density (PSD) for a third-order delta-sigma modulator operating at 12 MHz sampling frequency according to an embodiment of the present disclosure, FIG. 9 is a graph illustrating a PSD for a second-order delta-sigma modulator operating at 6 MHz sampling frequency according to an embodiment of the present disclosure, and FIG. 10 is a graph illustrating variation of SNR due to change of sampling frequency by using a delta-sigma modulator according to an embodiment of the present disclosure.

Referring to FIG. 8, it may be seen that the delta-sigma modulator including the loop filter according to an embodiment of the present disclosure operates with a noise shaping slope of 60 dB/decade when operated as a third-order loop filter. Also, referring to FIG. 9, it may be seen that the delta-sigma modulator including the loop filter according to an embodiment of the present disclosure operates with a noise shaping slope of 40 dB/decade when operated as a second-order loop filter. Also, referring to FIG. 10, when the loop filter included in the delta-sigma modulator according to an embodiment of the present disclosure is converted into the third-order loop filter or the second-order loop filter, measurement results of the SNR and the variation of the sampling frequency may be identified.

When the loop filter operates as the third-order loop filter, it may be seen that the SNR decreases sharply due to a low stability when the sampling frequency is below 6MHz. On the other hand, when the loop filter operates as the second-order loop filter, it may be seen that the SNR is measured relatively stable even when the sampling frequency is 6 MHz or less. Therefore, the delta-sigma modulator may be stably operated in a wide sampling frequency range by operating the loop filter as the second-order loop filter for a low sampling frequency range and operating the loop filter as the third-order loop filter for a high sampling frequency range.

The delta-sigma modulator including the loop filter capable of order conversion as described above may be applied to various fields. For example, in the GSM system which requires a high SNR for a narrow bandwidth, the loop filter may operate as a second-order loop filter on a narrow bandwidth and may achieve a high SNR by increasing the sampling frequency.

Meanwhile, in order to process a wide bandwidth signal, the loop filter may operate as a third loop filter. In particular, since the UMTS system requires a lower SNR than the GSM system, the requirement of the sampling frequency may be further alleviated by operating the loop filter as a third loop filter.

As described above, the delta-sigma modulator according to an embodiment of the present disclosure can be applied by flexibly converting the order of the loop filter to various systems requiring different bandwidths and SNRs.

Also, in case of a general delta-sigma modulator, the range of the stable sampling frequency is usually within two times. However, when the delta-sigma modulator including the loop filter capable of order conversion according to the present disclosure is used, if a high sampling frequency is required, a pulse having a high SNR in a wide bandwidth can be generated by operating the loop filter as a third loop filter. On the other hand, if a low sampling frequency is required, the loop filter can be operated as a second-order loop filter to generate a pulse with a low SNR in a narrow bandwidth. Here, in order to maintain the stability of the circuit when converting the order to the second-order loop filter, it is made possible to adjust the loop gain as described above.

In this manner, the delta-sigma modulator that operates stably even over a wide range of sampling frequencies can be implemented by dynamically performing the order conversion of the loop filter.

Meanwhile, the delta-sigma modulator according to an embodiment of the present disclosure can be mainly used at a receiving end of a communication system, and thus can be included in a communication terminal constituting the communication system.

Examples of the communication terminal may include a desktop computer, a laptop computer, a notebook, a smart phone, a tablet PC, a mobile phone, a smart watch, a smart glass, an e-book reader, a portable multimedia player (PMP), a portable game machine, a navigation device, a digital camera, a digital multimedia broadcasting (DMB) player, a digital audio recorder, a digital audio player, a digital video recorder, a digital video player, a PDA (Personal Digital Assistant), and the like.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A loop filter comprising:
    an operational amplifier; and
    a circuit including at least one capacitor, at least one resistor, and at least one switch which are connected to the operational amplifier,
    wherein signal transfer characteristics of the loop filter satisfy a third-order transfer function or a second-order transfer function by turning on or off the at least one switch, and
    wherein the circuit further includes:
    a first inverting circuit for outputting an inverted signal by inverting an input signal of the loop filter; and
    a second inverting circuit for outputting an inverted signal by inverting a signal output from an output end of the operational amplifier.

2. The loop filter according to claim 1, wherein the circuit further includes a first capacitor, a second capacitor, and a third capacitor which are connected in series between a first input end of the operational amplifier and the output end of the operational amplifier.

3. The loop filter according to claim 1, wherein the circuit further includes:

a first resistor having one end connected to a third node to which the input signal of the loop filter is applied and having another end connected to a first input end of the operational amplifier;

a second resistor, a fourth resistor, and a sixth resistor each having one end connected to a first node between a first capacitor and a second capacitor; and a third resistor, a fifth resistor, and a seventh resistor each having one end connected to a second node between the second capacitor and a third capacitor.

4. The loop filter according to claim 3, wherein another end of each of the second resistor and the third resistor is connected to a ground, another end of the fourth resistor is connected to the output end of the operational amplifier, another end of the fifth resistor is connected to an output end of the second inverting circuit, another end of the sixth resistor is connected to an output end of the first inverting circuit, and another end of the seventh resistor is connected to the third node.

5. The loop filter according to claim 4, wherein the circuit further includes:

a first switch connected between the first node and the sixth resistor;

a second switch connected between the second node and the seventh resistor;

a third switch connected to the first node and the first input end of the operational amplifier and configured in parallel with the first capacitor; and a fourth switch connected between the first node and the second resistor.

6. The loop filter according to claim 5, wherein the circuit satisfies the third-order transfer function by turning on the first switch, the second switch, and the fourth switch, and turning off the third switch.

7. The loop filter according to claim 5, wherein the circuit satisfies the second-order transfer function by turning off the first switch, the second switch, and the fourth switch, and turning on the third switch.

8. The loop filter according to claim 5, wherein the seventh resistor is a variable resistor, and a bandwidth variation due to control of the at least one switch is adjusted by adjusting the seventh resistor.

9. The loop filter according to claim 5, wherein at least one of the first resistor, the sixth resistor, and the seventh resistor is a variable resistor, and a loop gain is changed by adjusting the at least one of the first resistor, the sixth resistor, and the seventh resistor.

10. The loop filter according to claim 5, wherein the fourth resistor and the fifth resistor are variable resistors, and a resonance condition is adjusted by adjusting the fourth resistor and the fifth resistor.

11. The loop filter according to claim 10, wherein the resonance condition is maintained even when controlling the at least one switch to satisfy the third-order transfer function or the second-order transfer function.

12. A delta-sigma modulator comprising:

a loop filter for integrating and outputting a difference between an input signal and an analog signal;

a quantizer for quantizing and outputting a signal output from the loop filter; and a digital-to-analog converter (DAC) for outputting the analog signal by digital-to-analog converting a signal output from the quantizer, wherein the loop filter comprises:

an operational amplifier; and a circuit including at least one capacitor, at least one resistor, and at least one switch which are connected to the operational amplifier, wherein signal transfer characteristics of the loop filter satisfy a third-order transfer function or a second-order transfer function by turning on or off the at least one switch, and wherein the circuit includes:

a first inverting circuit for outputting an inverted signal by inverting the input signal; and a second inverting circuit for outputting an inverted signal by inverting a signal output from an output end of the operational amplifier.

13. The delta-sigma modulator according to claim 12, wherein the circuit further includes a first capacitor, a second capacitor, and a third capacitor which are connected in series between a first input end of the operational amplifier and an output end of the operational amplifier.

14. The delta-sigma modulator according to claim 13, wherein the circuit further includes:

a first resistor having one end connected to a third node to which the input signal is applied and having another end connected to the first input end of the operational amplifier;

a second resistor, a fourth resistor, and a sixth resistor each having one end connected to a first node between a first capacitor and a second capacitor; and a third resistor, a fifth resistor, and a seventh resistor each having one end connected to a second node between the second capacitor and a third capacitor.

15. The delta-sigma modulator according to claim 14, wherein each of other end of the second resistor and the third resistor is connected to a ground, another end of the fourth resistor is connected to the output end of the operational amplifier, another end of the fifth resistor is connected to an output end of the second inverting circuit, another end of the sixth resistor is connected to an output end of the first inverting circuit, and another end of the seventh resistor is connected to the third node.

16. The delta-sigma modulator according to claim 15, wherein the circuit further includes:

a first switch connected between the first node and the sixth resistor;

a second switch connected between the second node and the seventh resistor;

a third switch connected to the first node and the first input end of the operational amplifier and configured in parallel with the first capacitor; and a fourth switch connected between the first node and the second resistor.

17. The delta-sigma modulator according to claim 16, wherein the circuit satisfies the third-order transfer function by turning on the first switch, the second switch, and the fourth switch, and turning off the third switch.

18. The delta-sigma modulator according to claim 16, wherein the circuit satisfies the second-order transfer function by turning off the first switch, the second switch, and the fourth switch, and turning on the third switch.

19. A terminal including a delta-sigma modulator, wherein the delta-sigma modulator includes a loop filter comprising an operational amplifier; and a circuit including at least one capacitor, at least one resistor, and at least one switch which are connected to the operational amplifier, wherein signal transfer characteristics of the loop filter satisfy a third-order transfer function or a second-order transfer function by turning on or off the at least one switch, and wherein the circuit includes:

a first inverting circuit for outputting an inverted signal by inverting an input signal of the loop filter; and a second inverting circuit for outputting an inverted signal by inverting a signal output from an output end of the operational amplifier.

20. The terminal according to claim 19, wherein the circuit includes a first capacitor, a second capacitor, and a third capacitor which are connected in series between a first input end of the operational amplifier and an output end of the operational amplifier.

* * * * *